(12) United States Patent
Yasuda

(10) Patent No.: US 6,181,740 B1
(45) Date of Patent: Jan. 30, 2001

(54) SAMPLING SYSTEM

(75) Inventor: Akira Yasuda, Kanagawa (JP)

(73) Assignee: Kabushiki Kaisha Toshiba, Kawasaki (JP)

( * ) Notice: Under 35 U.S.C. 154(b), the term of this patent shall be extended for 0 days.

(21) Appl. No.: 08/972,175

(22) Filed: Nov. 18, 1997

(30) Foreign Application Priority Data

Nov. 28, 1996 (JP) .................................................. 8-317806

(51) Int. Cl.[7] .................................................. H03H 7/30
(52) U.S. Cl. .......................................... 375/232; 375/316
(58) Field of Search .................................... 375/316, 350, 375/232, 346, 348; 364/724.1; 341/122, 126, 155; 708/313

(56) References Cited

U.S. PATENT DOCUMENTS

| 4,472,785 | * | 9/1984 | Kasuga | 708/270 |
| 4,851,841 | * | 7/1989 | Sooch | 341/143 |
| 4,972,436 | * | 11/1990 | Halim et a. | 375/247 |
| 5,030,954 | * | 7/1991 | Ribner | 341/172 |
| 5,068,660 | * | 11/1991 | Swanson et al. | 341/143 |
| 5,103,229 | * | 4/1992 | Ribner | 341/143 |
| 5,150,120 | * | 9/1992 | Yunus | 341/143 |
| 5,212,659 | * | 5/1993 | Scott et al. | 364/724.1 |
| 5,311,181 | * | 5/1994 | Ferguson Jr. et al. | 341/143 |
| 5,451,950 | * | 9/1995 | Vincelette et al. | 341/150 |
| 5,557,642 | * | 9/1996 | Williams | 375/316 |
| 5,619,536 | * | 4/1997 | Gourgue | 375/316 |
| 5,680,418 | * | 10/1997 | Croft et al. | 375/346 |
| 5,734,683 | * | 3/1998 | Hulkko et al. | 375/316 |
| 5,748,126 | * | 5/1998 | Ma et al. | 341/143 |
| 5,786,778 | * | 7/1998 | Adams et al. | 341/61 |

OTHER PUBLICATIONS

David H. Shen, et al., A 900MH$_z$ Integrated Discrete–Time Filtering RF Front–End, IEEE International Solid–State Circuits Conference,(1996), pp. 54–55.

* cited by examiner

Primary Examiner—Don Vo
(74) Attorney, Agent, or Firm—Oblon, Spivak, McClelland, Maier & Neustadt, P.C.

(57) ABSTRACT

A sampling system arranged such that a modulated signal received by an antenna and input via a low noise amplifier and a band-pass filter is sampled at a sampling frequency higher than the signal band of the modulated signal by a first sample and hold circuit and is input to an analog decimation filter to remove a frequency component which may turn out to be aliasing noise. The output of the analog decimation filter is sampled with a sampling frequency lower than the sampling frequency of the first sample and hold circuit by a second sample and hold circuit and is digitized by an A/D converter to be demodulated by a demodulator. The sampling system which can convert the modulated signal into a low frequency without using the highly precision mixer circuit or a filter having sharp characteristics may be provided by constructing as described above.

7 Claims, 9 Drawing Sheets

SAMPLING SYSTEM

BACKGROUND OF THE INVENTION

1. Field of the Invention

The present invention relates to a sampling system suited for frequency-converting a modulated signal into a low frequency and a radio receiving device using the sampling system.

2. Description of Related Art

FIG. 1 shows the typical structure of a receiving device of a portable telephone and other mobile communication radio equipment. It is a radio receiving device of a double super-heterodyne system, wherein a modulated signal received by an antenna 11 is amplified by a low noise amplifier (LNA) 12 and is then input to a band-pass filter 13 having a relatively moderate characteristic for suppressing an image signal. The signal output from the band-pass filter 13 is frequency-converted in a first mixer 14 by a local signal from a local oscillator 15 into a signal having a first intermediary frequency. The signal frequency-converted by the first mixer 14 is input to a second mixer 17 via an IF filter 16 to be frequency-converted into a signal having a second intermediary frequency which is lower than the first one by a local signal from a local oscillator 18. The signal frequency-converted by the second mixer 17 is input to an A/D converter 20 via an IF filter 19 to be converted into a digital signal. The digital signal output from the A/D converter 20 is then demodulated by a demodulator 21.

Here, it is very difficult to reduce the size of the circuit because the mixers 14 and 17 are composed of analog devices in general. Although mixer circuits which are suitable for the miniaturization of the circuit have been proposed and put into the practical use so far, all of them have had a problem that the power consumption is large or the circuit is complicated because they are intended to attain an enough dynamic range and performances such as low distortion characteristics.

Further, the IF filters 16 and 19 are required to have a highly accurate frequency selectivity in order to select a signal having the frequency of the received channel and to remove the signal having the image frequency in the double super-heterodyne system as shown in FIG. 1. Because an IF filter needs to be composed of passive parts such as a ceramic filter in many cases to enhance the frequency selectivity, the size of the filter becomes large and it is not suited for the use of the radio receiving device of portable equipment which are required to be miniaturized.

Meanwhile, there is a down-sampling system as shown in FIG. 2 as another method for constructing the radio receiving device. A modulated signal received via an antenna 21 is amplified by a low noise amplifier (LNA) 22 and the unnecessary frequency component is removed by a band-pass filter 23. Then, it is down-sampled in a sampling frequency which is lower than a center frequency of the modulated signal by an A/D converter 24 to be converted into a digital signal. The digital signal converted by the A/D converter 24 is demodulated by a demodulator 25.

Although the structure of the whole system may be miniaturized because no mixer nor IF filter are necessary in the down-sampling system shown in FIG. 2, there has been a problem that the band-pass filter 23 is required to have a high frequency selectivity and the size of the filter becomes also large because the noise signal (hereinafter referred to as aliasing noise) aliased due to the sampling in the A/D converter 24 needs to be removed by the band-pass filter 23.

There has been also another demerit that the noise figure (NF) becomes worse because the A/D converter 24 is required to use a high down-sampling ratio in this arrangement.

As described above, the radio receiving device of the prior art double super-heterodyne system has had the problems that (1) because the mixer is required to have the wide dynamic range and the low distortion characteristic, the mixer requires the large quantity of power consumption and complicates the circuit structure and (2) the IF filter (e.g. the ceramic filter) having the high frequency selectivity is required to select the frequency signal of the received channel and to remove the signal of the image frequency, increasing the dimension of the filter required here.

The radio receiving device of the system of down-sampling the modulated signal directly by the A/D converter has had the problems that the dimension of the filter increases and the noise figure becomes worse due to the high down-sampling ratio, i.e. the generated noise increases, because the filter having the high frequency selectivity such as the ceramic filter or a dielectric filter is required in the radio frequency signal processing section in order to remove the aliasing noise generated during the down-sampling.

SUMMARY OF THE INVENTION

Accordingly, it is an object of the present invention to solve the above-mentioned problems of the prior art radio receiving device by providing a sampling system which converts a modulated signal into a signal having a low frequency by a simpler circuit structure without using the small-scale, high precision and expensive mixer circuit and the filtering circuit The inventive sampling system is characterized basically in that a received modulated signal is sampled in a frequency belonging to a higher band than the frequency band of the modulated signal in a first sampling circuit and the modulated signal is converted into a certain low frequency signal by a second sampling circuit after passing the sampled signal through an analog decimation filter to suppress the signal which may turn out to be aliasing noise. Here, the analog decimation filter has a function of removing the signal component of the frequency band which causes the aliasing noise from the input signal component in order to suppress the occurrence of an aliasing noise signal which occurs due to the down-sampling of the signal. Typically, the analog decimation filter is composed of a FIR filter.

According to this sampling system, the mixer circuit which is required to have the highly accurate characteristic like the prior art heterodyne receiving system becomes unnecessary and the function of the IF filter having the sharp characteristic for suppressing an image signal may be given to the analog decimation filter, so that the circuit scale of the radio equipment may be miniaturized.

Further, as for the output signal of the analog decimation filter, it may have a sampling frequency lower than the sampling frequency used in the pre-stage of the analog decimation filter and it is permitted to operate at the slower clock frequency, so that the radio equipment may be realized readily and the electric power consumed in the radio equipment may be reduced.

It is also possible to sequentially sample the modulated signal by composing the first sampling circuit by a plurality of sampling elements and by using those sampling elements selectively. Such a structure allows the radio equipment to be realized more readily because the individual sampling element may be operated at the slower sampling frequency as compared to the case of sampling the modulated signal by one sampling circuit.

When the first sampling circuit is composed of the plurality of sampling elements and when the predetermined weighting is implemented on the output signal of each sampling element and the output signals are added, a filtering characteristic may be given to the added signal, so that the analog decimation filter may be realized by this structure.

The individual sampling element composing the first sample and hold circuit may be composed of a plurality of switches and a plurality of capacitors connected respectively in series to those switches. In this case, the output of each sampling element may be weighted by the capacity of the capacitors.

When the radio equipment is constructed by disposing a $\Delta\Sigma$ modulator at the latter stage of the second sampling circuit, the addition of the signals weighted in accordance to the degree of the capacity of the capacitor contained in the sampling circuit may be implemented by an integrator within the $\Delta\Sigma$ modulator.

Further, a sampling system equipped with each different frequency characteristic may be realized by disposing a plurality of sampling systems having the filtering characteristics by such method of weighted addition in parallel and differentiating the sampling frequencies of the first and second sampling circuits and the weighting factors of the weighting among unit sampling systems having those frequency characteristics. By constructing as described above, each frequency band may be set at different pass bands.

In this case, the modulated signal in a wide frequency range may be frequency-converted as an input signal as a whole by setting such that the frequency bands of signals to be transmitted in each filter adjoin each other. When it is arranged such that the frequency bands of the signals to be transmitted in each filter are disposed at the intervals of channels of the modulated signal, the receiving signal channel maybe selected by selecting the frequency band.

The above and other advantages of the invention will become more apparent in the following description and the accompanying drawings in which like numerals refer to like parts.

DESCRIPTION OF PREFERRED EMBODIMENTS

The preferred embodiments of the present invention will be explained below with reference to the drawings.

[First Embodiment]

Figure 1:
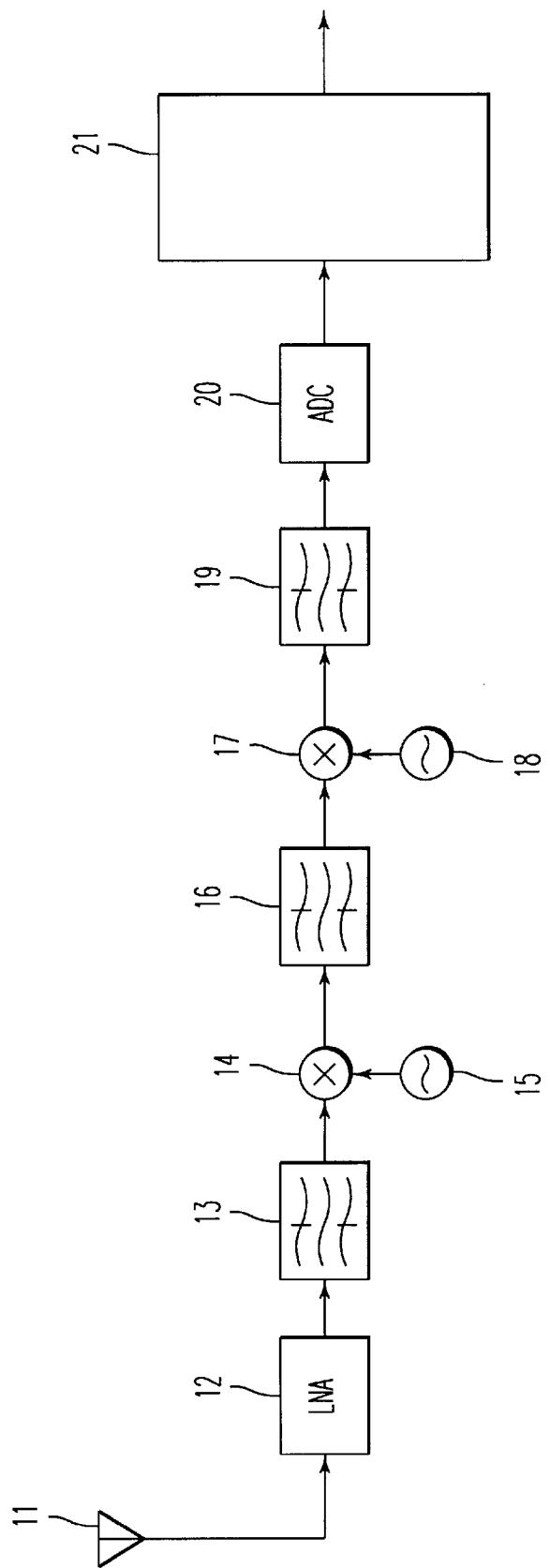
FIG. 1 is a block diagram showing the structure of a radio receiving device constructed by means of the prior art double super-heterodyne system.
Figure 2:
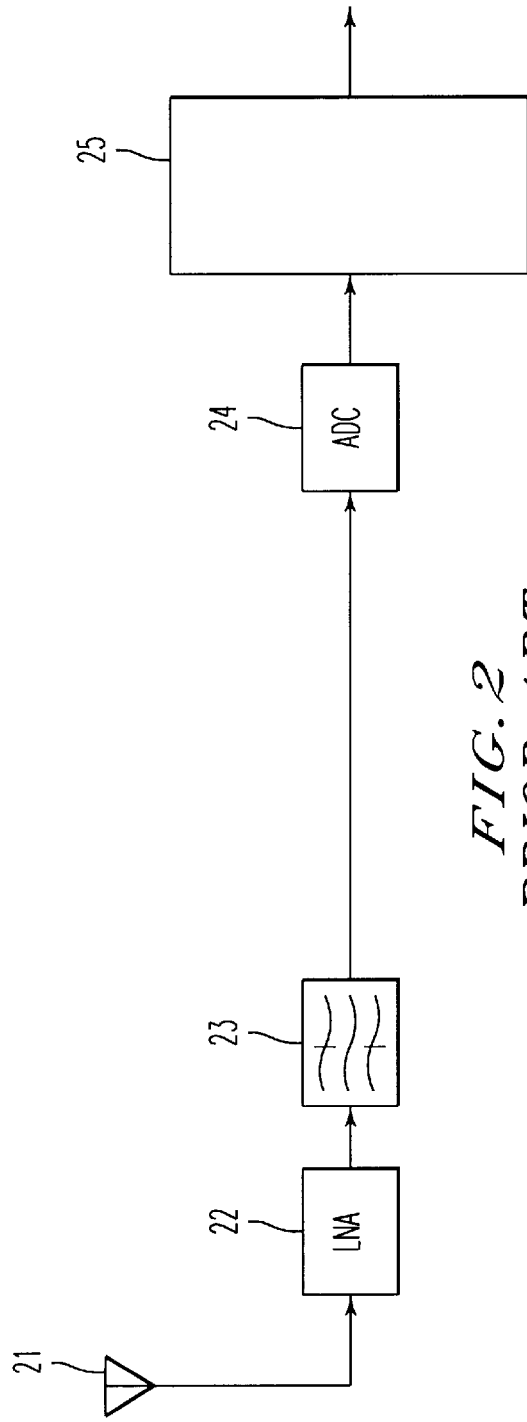
FIG. 2 is a block diagram showing the structure of a radio receiving device constructed by means of the prior art down sampling receiving system.
Figure 3:
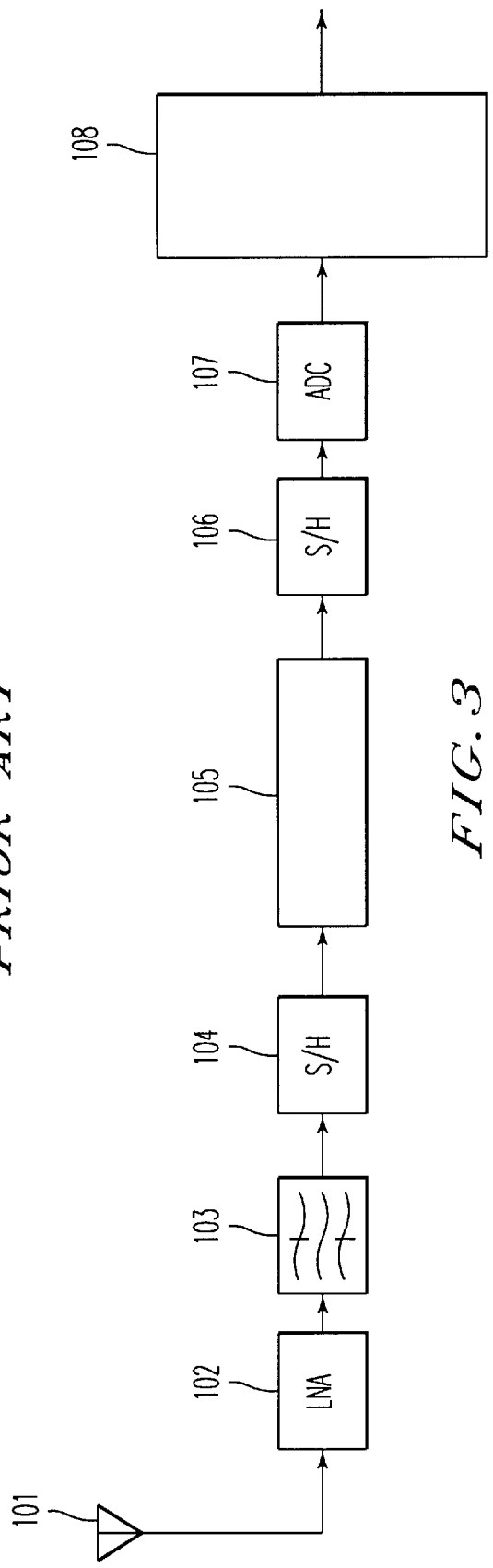
FIG. 3 is a block diagram showing the structure of a radio receiving device using a sampling system of a first embodiment of the present invention.

FIG. 3 is a block diagram showing the structure of a radio receiving device using a sampling system of a first embodiment of the present invention. A modulated signal received by an antenna 101 is amplified by a low noise amplifier (LNA) 102 and is then input to a band-pass filter 103 having a relatively moderate characteristic for suppressing an image signal.

The signal output from the band-pass filter 103 is over-sampled by a first sample and hold circuit 104. That is, the sampling frequency fs1 of the first sample and hold circuit 104 is set at a frequency higher than the signal band fb of the modulated signal, or more concretely, at a frequency higher than the signal band fb by twice or more. The first sample and hold circuit 104 oversamples with respect to the input signal band.

When the sampling frequency of the first sample and hold circuit 104 is set with respect to the carrier frequency fin of the modulated signal at $fs1=fin/N$, the modulated signal is frequency-converted into a DC area by the first sample and hold circuit 104 when an integer is selected for N and is frequency-converted into an intermediate frequency (IF) by the first sample and hold circuit 104 when a number other than integers is selected for N.

The modulated signal sampled by the first sample and hold circuit 104 is input to an analog decimation filter 105. The analog decimation filter 105 reduces the frequency component of the signal which turns out to be aliasing noise contained in the input signal, and the modulated signal is down-sampled by a second sample and hold circuit 106 described later.

The output signal of the analog decimation filter 105 is sampled (i.e. down-sampled) by the second sample and hold circuit 106 with a sampling frequency fs2 which is lower than the sampling frequency fs1 of the first sample and hold circuit 104 to be frequency-converted into a signal of a desired low frequency. Because the frequency component of the signal which turns out to be the aliasing noise is suppressed by the analog decimation filter 105 at this time, the aliasing noise generated in the second sample and hold circuit 106 is suppressed to the minimum.

The signal down-sampled in the second sample and hold circuit 106 is converted into a digital signal by an A/D converter 107 and is then demodulated by a demodulator 108.

According to the present embodiment, the frequency component of the signal which turns out to be the aliasing noise is suppressed by the analog decimation filter 105, and then the signal is re-sampled at a predetermined sampling period by the second sample and hold circuit 106. While the sampling frequency fs1 of the input signal is high, the sampling frequency of its output signal is low. Accordingly, the analog decimation filter 105 may be realized by a FIR filter or a IIR filter which is composed of a switched capacitor filter and the like and may be built in an IC. Therefore, it becomes unnecessary to have the large IF filter and the band-pass filter which are composed of the ceramic filter or a dielectric filter and the like and which have been essential in the prior art double super-heterodyne system and the down-sampling system and the miniaturization of the radio equipment may be realized.

Further, because no highly accurate frequency converter circuit (mixer circuit) which has been necessary in the past is used in the present embodiment, it is advantageous for the miniaturization of the radio equipment also in this point. In connection with that, the power consumption may be also reduced.

Further, because the modulated signal has been frequency-converted into the DC component or the intermediate frequency (IF) band by the first sample and hold circuit 104, the down-sampling ratio fs1/fs2 in the second sample and hold circuit 106 needs not be so large, not inviting the aggravation of the noise figure.

[Second Embodiment]

Figure 4:
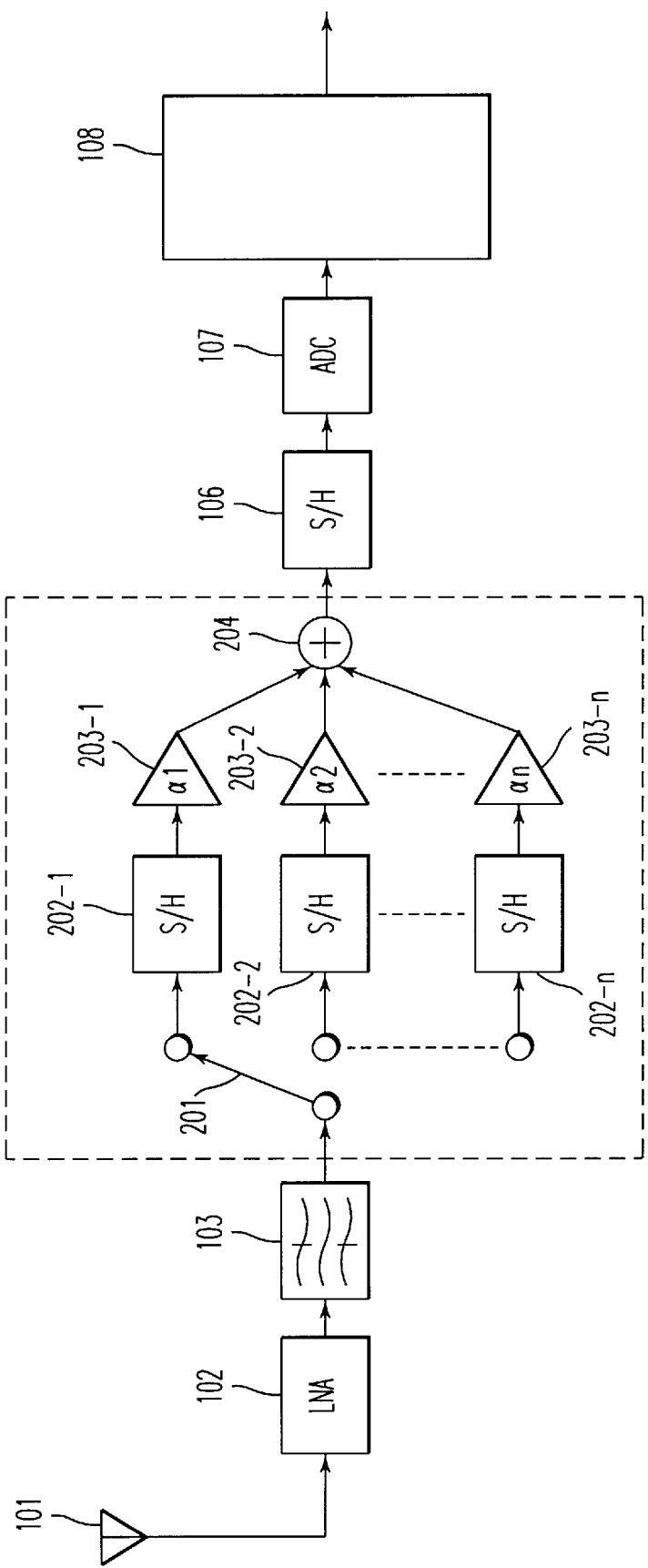
FIG. 4 is a block diagram showing the structure of a radio receiving device using a sampling system of a second embodiment of the present invention.

FIG. 4 is a block diagram showing the structure of a radio receiving device using a sampling system of a second embodiment of the present invention. The present embodiment is arranged such that the part of the first sample and hold circuit 104 and the analog decimation filter 105 in FIG. 3 is replaced by a first sample and hold circuit 200 having a filtering function.

A modulated signal received by the antenna 101 is amplified by the low noise amplifier (LNA) 102 and is then input to the band-pass filter 103 having a relatively moderate characteristic for suppressing an image signal.

The signal output from the band-pass filter 103 is input to the sample and hold circuit 200 having the first filtering function to be sampled with the sampling frequency fs1 which is higher than the signal band of the modulated signal, similarly to the first embodiment. In the sample and hold circuit 200 having the first filtering function, the input signal is input sequentially to a plurality of sample and hold circuits 202-1, 202-2, . . . , 202-n via a selector. At this time, the switching frequency of the selector 201 becomes the sampling frequency fs1. The output signals of the sample and hold circuits 202-1, 202-2, . . . , 202-n are added by an adder 204 after being weighted by a predetermined weight factor by the weighting circuits 203-1, 203-2, . . . 203-n each comprising a multiplier.

The output signal of the adder 204 is down-sampled by the second sample and hold circuit 106 with the sampling frequency fs2 similarly to the first embodiment and is then converted into the digital signal by the A/D converter 107 to be demodulated by the demodulator 108.

According to the present embodiment, the sampling frequency fs1 of the sample and hold circuit 200 having the first filtering function is the switching frequency of the selector 201 and each individual sampling frequency of the sample and hold circuits 202-1, 202-2, . . . , 202-n may be reduced to 1/n (fs1/n) of the sampling frequency of the first sample and hold circuit 104 in the first embodiment, where n is the number of the sample and hold circuits 202-1, 202-2, . . . , 202-n, so that the sample and hold circuits 202-1, 202-2, . . . , 202-n may be operated at lower speed, facilitating the realization of the radio equipment.

The output signals of the first sample and hold circuits 202-1, 202-2, . . . , 202-n are weighted by the weighting circuits 203-1, 203-2, . . . 203-n and are added by the adder 204. The frequency characteristic (filtering characteristic) may be given to the sample and hold circuit 200 having the filtering function and the frequency characteristic of the output signal of the adder 204 maybe arbitrarily set by adjusting the value of the weighting.

For instance, it becomes possible to reduce the component (high and low frequency components) other than the required frequency band when this filtering characteristic is used as the band-pass characteristic. Accordingly, the signal of the frequency component other than the desired signal may be removed before the signal is input to the second sample and hold circuit 106, so that the aliasing noise caused by the down-sampling may be fully reduced even when the down-sampling is carried out in the second sample and hold circuit 106.

When the ratio of the carrier frequency fin of the modulated signal to the sampling frequency (the switching frequency of the selector 201) fs1 of the sample and hold circuit 200 having the first filtering function is assumed to be $N=fin/fs1$, the sample and hold circuit 200 having the first filtering function oversamples the carrier frequency fin when $N<0.5$.

In this case, a filter having a pass band of the signal band of the modulated signal may be structured by the weighted addition of the weighting circuits 203-1, 203-2, . . . 203-n and the adder 204 and by this filter, the sampling frequency may be reduced while reducing the aliasing noise caused when down-sampling is implemented with the sampling frequency fs2 by the second sample and hold circuit 106.

When the down-sampling ratio $M=fs1/fs2$ is selected to be an integer, the modulated signal is converted into a base band signal. When a number other than integers is selected for M, the modulated signal is converted into an intermediate frequency. At this time, the frequency of the output signal of the second sample and hold circuit 106 is expressed as follows:

$$int\left[\frac{fin}{\frac{fs1}{2m}}\right]:\text{odd} \quad \left(int\left[\frac{fin}{\frac{fs1}{2m}}\right]+1\right)\frac{fs1}{2m}-fin$$

$$int\left[\frac{fin}{\frac{fs1}{2m}}\right]:\text{even} \quad fin-int\left[\frac{fin}{\frac{fs1}{2m}}\right]\frac{fs1}{2m}$$

When, n>0.5 on the other hand, the modulated signal is down-sampled with respect to the carrier frequency fin in the first sample and hold circuit 200 which also acts as the filter. In this case, the frequency fin of the received modulated signal is frequency-converted into the frequency fin2 by the sampling with the sampling frequency (the switching frequency of the selector 201) fs1 of the sample and hold circuit 200 having the first filtering function, as follows:

$$int\left[\frac{fin}{2fs1}\right]:\text{odd} \quad fin2=\left(int\left[\frac{fin}{2fs1}\right]+1\right)\frac{fs1}{2}-fin$$

$$int\left[\frac{fin}{2fs1}\right]:\text{even} \quad fin2=fin-int\left[\frac{fin}{2fs1}\right]\frac{fs1}{2}$$

Here, the frequency fin2 is converted into a frequency fin3 when the output signals of the sample and hold circuits 202-1, 202-2, . . . , 202-n are down-sampled with the sampling frequency fs2 in the second sample and hold circuit 106 after removing the signal component of the unnecessary frequency band by the weighted addition of the weighting circuits 203-1, 203-2, . . . 203-n and the adder 204, as follows:

$$int\left[\frac{fin}{\frac{fs1}{2m}}\right]: odd \quad fin3 = \left(int\left[\frac{fin}{\frac{fs1}{2m}}\right]+1\right)\frac{fs1}{2m} - fin$$

$$int\left[\frac{fin}{\frac{fs1}{2m}}\right]: even \quad fin3 = fin - int\left[\frac{fin}{\frac{fs1}{2m}}\right]\frac{fs1}{2m}$$

According to the present embodiment, the filtering characteristic for reducing the signal component of the unnecessary frequency band may be realized by implementing the weighted addition by the weighting circuits 203-1, 203-2, . . . 203-n and the adder 204 and by adequately adjusting the value of the weighting of each. In this case, because the weighting circuits 203-1, 203-2, . . . 203-n and the adder 204 may be built in an integrated circuit by forming them on a semiconductor substrate, the large IF filter and the band-pass filter which are composed of the ceramic filter which have been necessary in the prior art double super-heterodyne system and the down-sampling system become unnecessary and the radio equipment can be miniaturized.

Further, because the individual sampling frequency may be reduced to 1/n of the sampling frequency fs1 of the first sample and hold circuit 104 in the first embodiment by sampling the modulated signal by the plurality of first sample and hold circuits 202-1, 202-2, . . . , 202-n, respectively, the sample and hold circuit may be constructed more easily.

[Third Embodiment]

Figure 5:
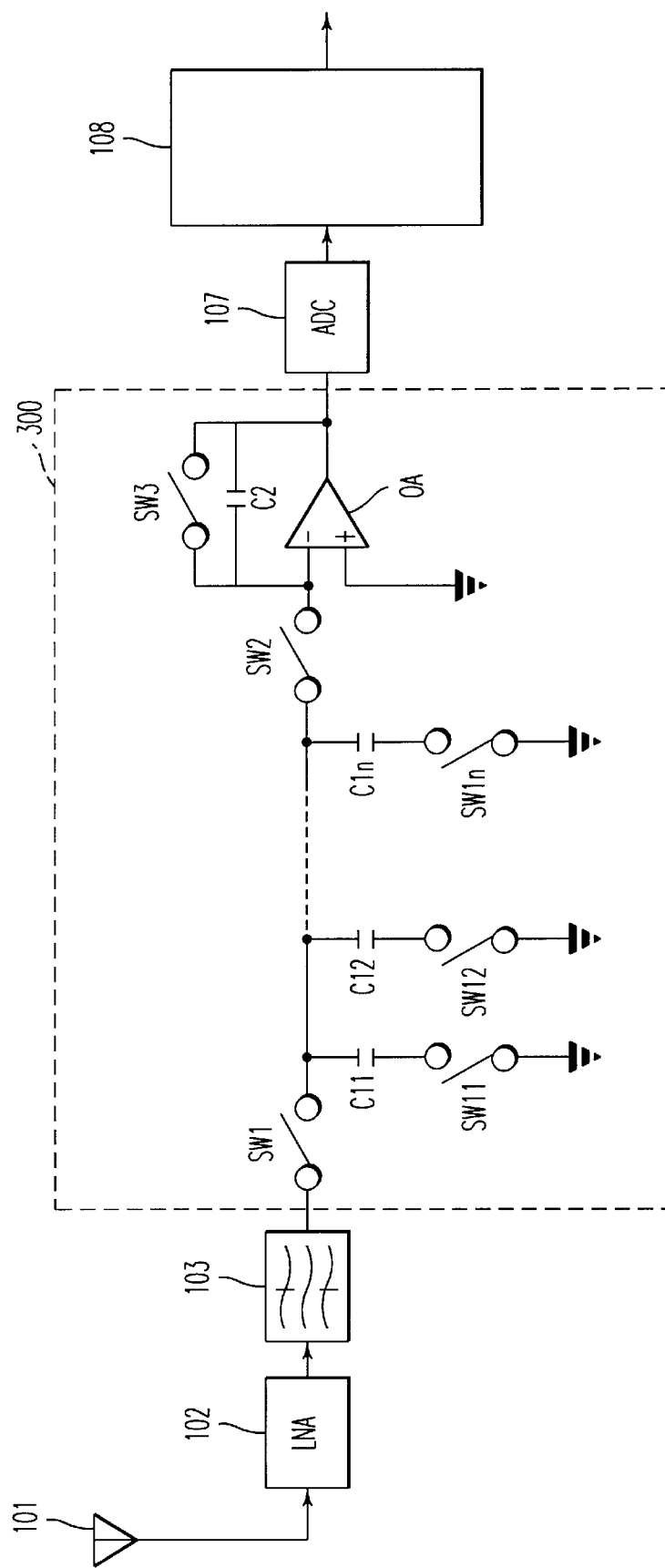
FIG. 5 is a block diagram showing the structure of a radio receiving device using a sampling system of a third embodiment of the present invention.
Figure 6:
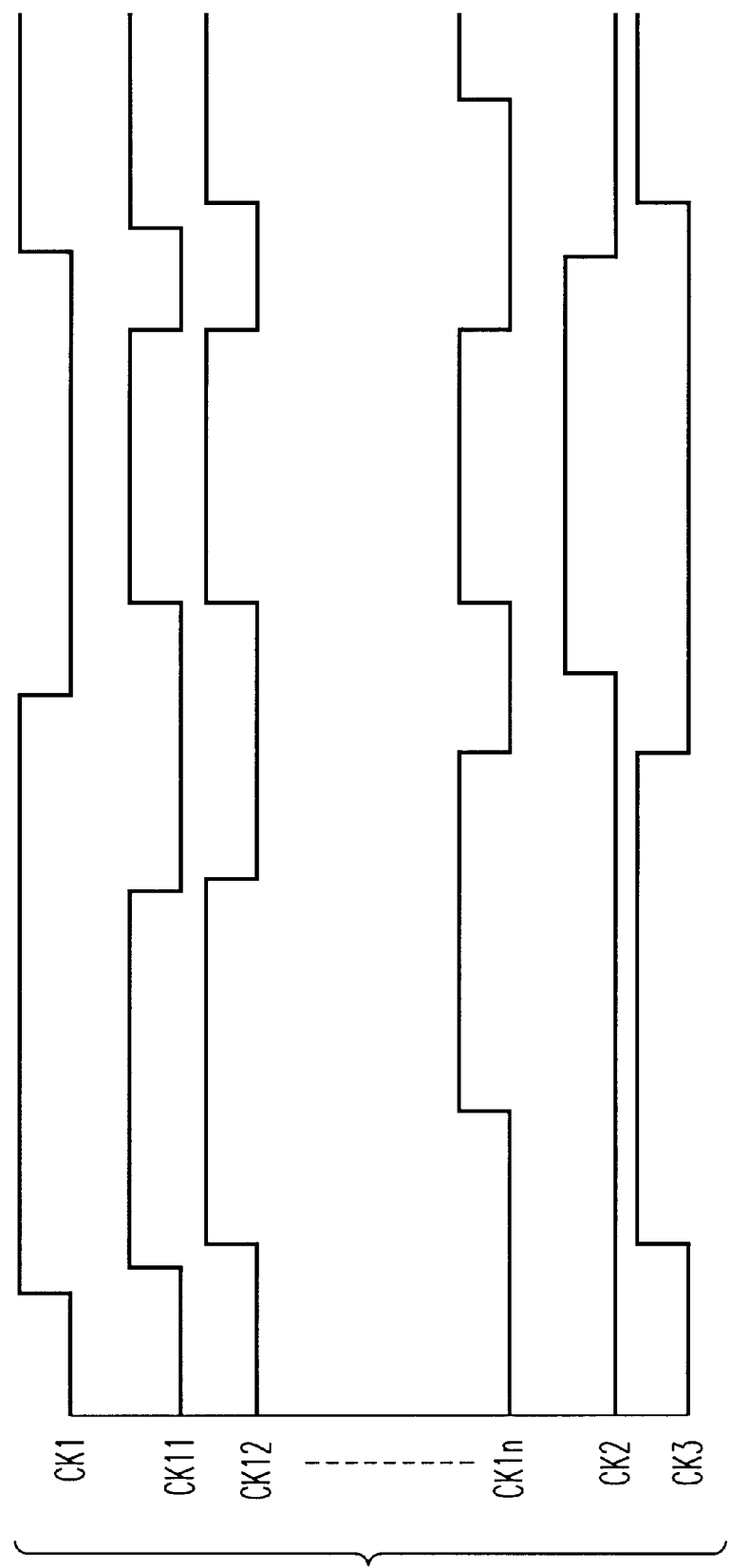
FIG. 6 is a timing chart for explaining the operation of the radio receiving device shown in FIG. 5.

FIG. 5 is a block diagram showing the structure of a radio receiving device using a sampling system of a third embodiment of the present invention. The present embodiment is arranged such that the part of the first sample and hold circuit 104, the analog decimation filter 105 and the second sample and hold circuit 106 in FIG. 3 are replaced by a sample and hold circuit 300 having the first and second sample and hold circuit which functions also as a filter in FIG. 5. FIG. 6 is a timing chart for explaining the operation of the radio receiving device shown in FIG. 5.

In FIG. 5, a modulated signal received by the antenna 101 is amplified by the low noise amplifier (LNA) 102 and is then input to the band-pass filter 103 having a relatively moderate characteristic for suppressing an image signal. The signal output from the band-pass filter 103 is input to the first and second sample and hold circuit 300 which functions also as a filter. The sample and hold circuit 300 having the filtering function comprises a plurality of sample and hold circuits composed of a plurality of capacitors C11 through C1n and sampling switches SW11 through SW1n connected in series to the capacitors C11 through C1n, switches SW1 and SW2 inserted in series on the common input side and the common output side of those sample and hold circuits and a second sample and hold circuit composed of an operational amplifier OA, a sampling switch SW3 and a capacitor C2 connected in parallel with the amplifier OA between an inversion input terminal and an output terminal thereof.

The switches SW1, SW11 through SW1n, SW2 and SW3 are controlled by clocks CK1, CK11 through CK1n, CK2 and CK3 shown in FIG. 6, respectively, and are turned ON when the clock is at high level and are turned OFF when it is at low level.

At first, the switch SW1 is turned ON when the clock CK1 turns to high level. During this time, the switches SW11 through SW1n turn ON as the clocks CK11 through CK1n turn to high level sequentially and the input signal (output signal of the band-pass filter 103) is applied to the capacitors C11 through C1n sequentially. The switches SW11 through SW1n are turned OFF sequentially as the clocks CK11 through CK1n turn to low level sequentially. Thus, the input signal is sampled with time intervals of the clocks CK11 through CK1n by the switches SW11 through SW1n and is held in the capacitors C11 through C1n.

Next, after the clock CK1 turns to low level and the switch SW1 turns OFF, the clocks CK11 through CK1n turn to high level simultaneously and the switches SW11 through SW1n turn ON again. Then, when the clock CK2 turns to high level and the switch SW2 turns ON, the electric charge accumulated in the capacitors C11 through C1n is transferred to the capacitor C2 to be added. At this time, the clock CK3 is at low level and the switch SW3 connected in parallel with the capacitor C2 is OFF.

Thus, after the charge accumulated in the capacitors C11 through C1n is added in the capacitor C2, the clock CK3 turns to high level and the switch SW3 turns ON. Thereby, the capacitor C2 is reset and the same operation is repeated.

The sampling frequency fs1 of the first sample and hold circuit is determined by the time intervals of the leading edges of the clocks CK11 through CK1n during the period when the clock CK1 is at high level and the switch SW1 is ON and is selected to be higher than the signal band of the received modulated signal. The sampling frequency fs2 of the second sample and hold circuit is determined by the period of the clock CK3 and is lower than the sampling frequency fs1 of the first sample and hold circuit.

According to the present embodiment, the operation of sum of products can be implemented by weighting the output of the first sample and hold circuit by differentiating the capacity of the capacitors C11 through C1n. That is, it is possible to give the filtering characteristic to the plurality of first sample and hold circuits composed of the capacitors C11 through C1n and the sampling switches SW11 through SW1n.

Although the sampling by means of the switches SW11 through SW1n must be implemented very quickly at this time, the operation of the operational amplifier OA may be slow because the transfer of the electric charge when the switch SW2 is ON may be carried out with the sampling frequency of the down-sampling in the second sample and hold circuit. It is possible to realize high speed sampling because the speed when the switch is turned OFF is very fast when the switch is composed of a CMOS transistor.

Further, because the timing for turning OFF the switch is determined by a voltage Vgs between a gate and a source of the CMOS transistor, the sampling may be carried out accurately without being influenced by the input signal voltage.

Further, the electric charge in the capacitors C11 through C1n may be accumulated across a period of time which is longer than the sampling time, so that the influence caused by time constants of the capacitors C11 through C1n and the switches SW11 through SW1n may be reduced.

Thus, the present embodiment allows the high speed sampling and the removable of the frequency component out of the band to be realized readily by the contemporary technology.

[Fourth Embodiment]

Figure 7:
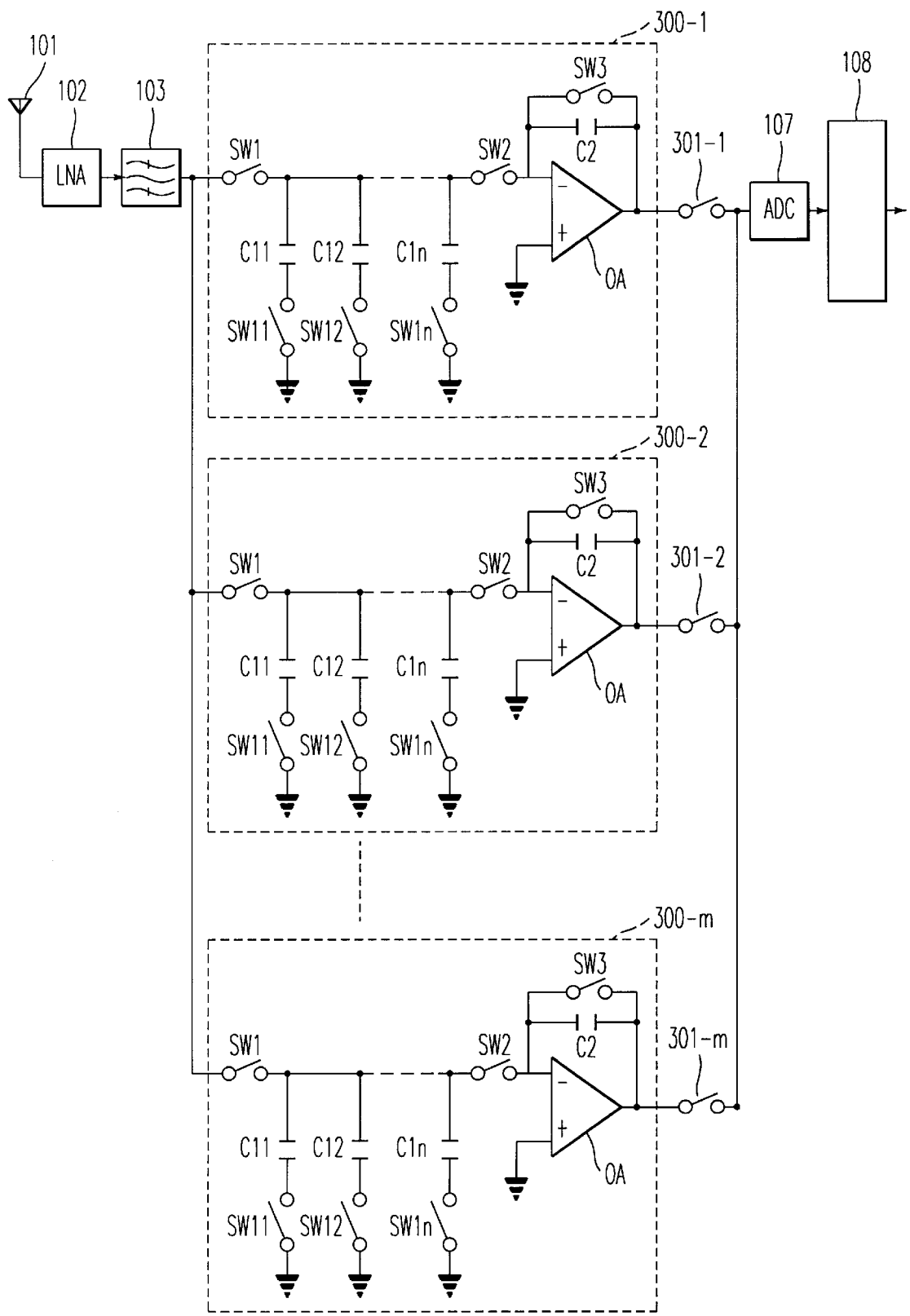
FIG. 7 is a block diagram showing the structure of a radio receiving device using a sampling system of a fourth embodiment of the present invention.

FIG. 7 is a block diagram showing the structure of a radio receiving device using a sampling system of a fourth embodiment of the present invention. According to the present embodiment, a plurality (m) of sample and hold circuits 300 each having the first and second filtering functions and composed of the switch SW1, the capacitors C11 through C1n, the switches SW11 through SW1n, the switch SW2, the capacitor C2, the switch SW3 and the operational amplifier OA in the third embodiment are disposed like 300-1, 300-2, . . . , 300-m in parallel. Switches 301-1, 301-2, . . . 301-m are inserted between the output ends of the sample and hold circuits 300-1, 300-2, . . . , 300-m and the input end of an A/D converter 107, respectively, and output signals of the sample and hold circuits 300-1, 300-2, . . . , 300-m having the first and second sampling and holding circuits which have filtering functions are input to the A/D converter 107 sequentially by the switches 301-1, 301-2, . . . , 301-m.

Although the number (n) of the first sample and hold circuits, i.e. the number of the sampling switches SW11 through SW1n and the number of the capacitors C11 through C1n may be increased to increase the weighting factors when it is necessary to sharpen the filtering characteristic in the third embodiment described above, n cannot be increased more than fs1/fs2. It is because the sampling period per first sample and hold circuit increases more than the period of fs2 when n is increased more than fs1/fs2. Then, all the electric charge accumulated in the capacitors C11 through C1n cannot be added in the capacitor C2 and the normal operation cannot be obtained.

Then, when the plurality (m) of sample and hold circuits 300-1, 300-2, . . . , 300-m having the same structure with the sample and hold circuit 300 having the first and second filtering functions in the third embodiment are used and are disposed in parallel to operate sequentially like the present embodiment, the total number of the first sample and hold circuits which determines the filtering functions becomes n×m, so that the filtering characteristic which is sharper than that of the third embodiment may be realized without increasing n unnecessarily, i.e. while maintaining the normal operation.

Accordingly, the present embodiment allows the characteristics like a channel selection filter to be realized and makes the expensive IF filter which has been necessary in the past unnecessary, thus reducing the cost.

[Fifth Embodiment]

Figure 8:
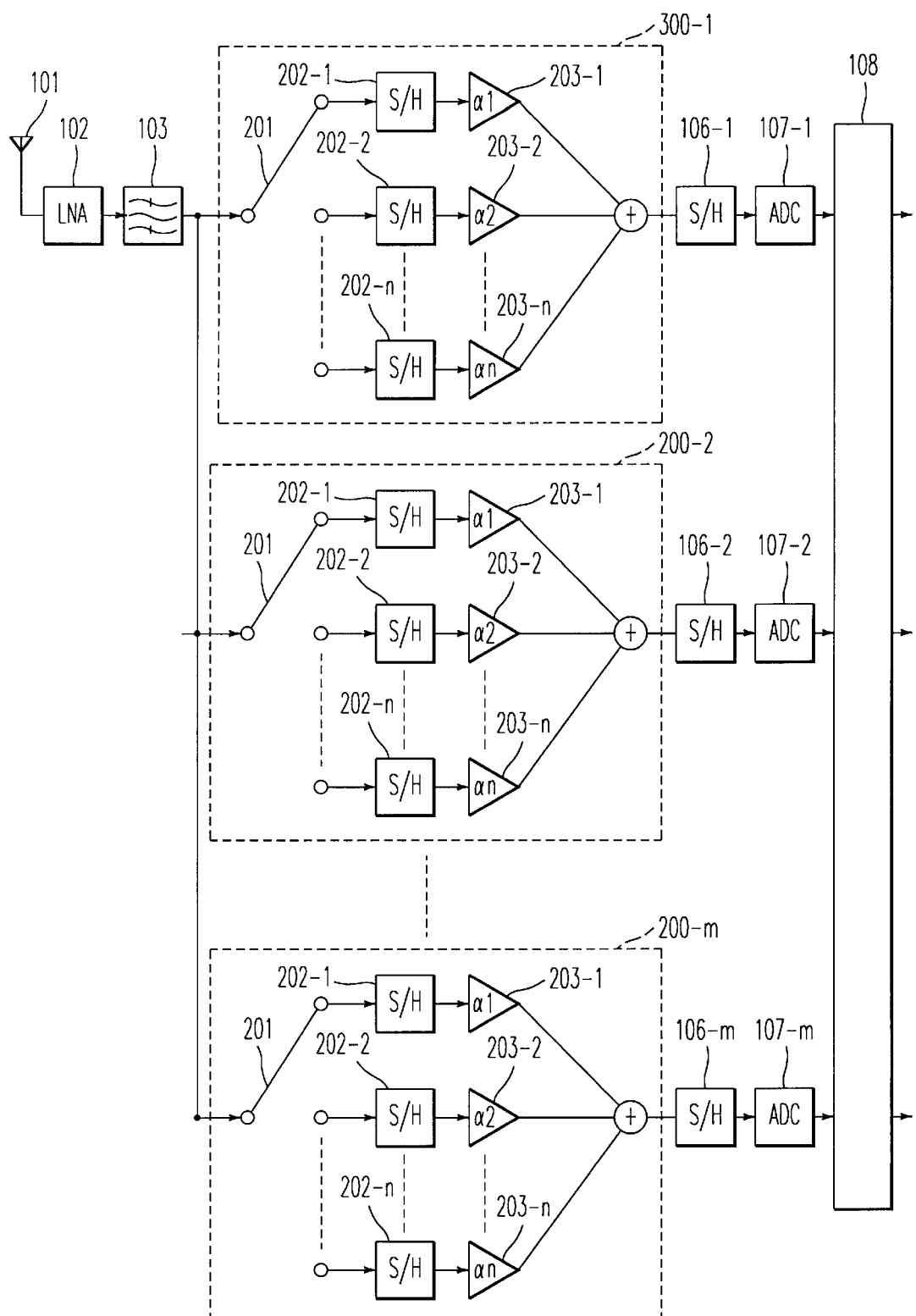
FIG. 8 is a block diagram showing the structure of a radio receiving device using a sampling system of a fifth embodiment of the present invention.

FIG. 8 is a block diagram showing the structure of a radio receiving device using a sampling system of a fifth embodiment of the present invention. The present embodiment is different from the embodiments described above so far in that it is arranged so that a modulated signal in a wide frequency range can be frequency-converted by disposing a plurality (m) of sample and hold circuits 200-1 through 200-m having the first filtering function and a plurality (m) of sample and hold circuits 106-1 through 106-m in parallel and by shifting the pass band frequency of each filter.

The output signal of the band-pass filter 103 is filtered as it is input sequentially to first sampling circuits 202-1, 202-2, . . . , 202-n via a selector 201 in each of the sample and hold circuits 200-1 through 200-m having the first filtering function to be sampled, is weighted by the weighting circuits 203-1, 203-2, . . . , 203-n and is added by the adder 204.

Here, the weighting factors for weighting the filter in each of the sample and hold circuits 200-1 through 200-m having the first filtering function are differentiated to shift the frequency characteristic of each to set the pass band in the frequency bands which are different from each other. In this case, the modulated signal in a wide frequency range may be frequency-converted as a whole by setting the frequency bands of each filter so that they adjoin each other. The received channel (receiving frequency) may be selected by the bank to be used by disposing the frequency bands of each filter at intervals of the channel of the modulated signal.

Furthermore, all of sample and hold circuits 200-1 through 200-m need not be sampled by a same sampling period. One sample and hold circuit sampled by a smaller sampling period (that runs in higher sampling frequency) could cover a broader frequency bandwidth, and another sample and hold circuit sampled by a larger sampling period (that runs in lower sampling frequency) could cover a narrower frequency bandwidth.

Although the receiving channel has been set by varying the frequency of the local oscillator in the prior art super-heterodyne system or the double super-heterodyne system, the receiving channel may be selected without using the local oscillator having the variable frequency in the present embodiment. That is, the expensive local oscillator of the variable frequency using a PLL circuit which has been necessary in the past becomes needless in the present embodiment. It also exerts an effect that because the PLL circuit whose frequency switching time is slow is not used, the receiving channel may be switched quickly and the power consumption may be reduced because the PLL circuit is not used.

[Sixth Embodiment]

Figure 9:
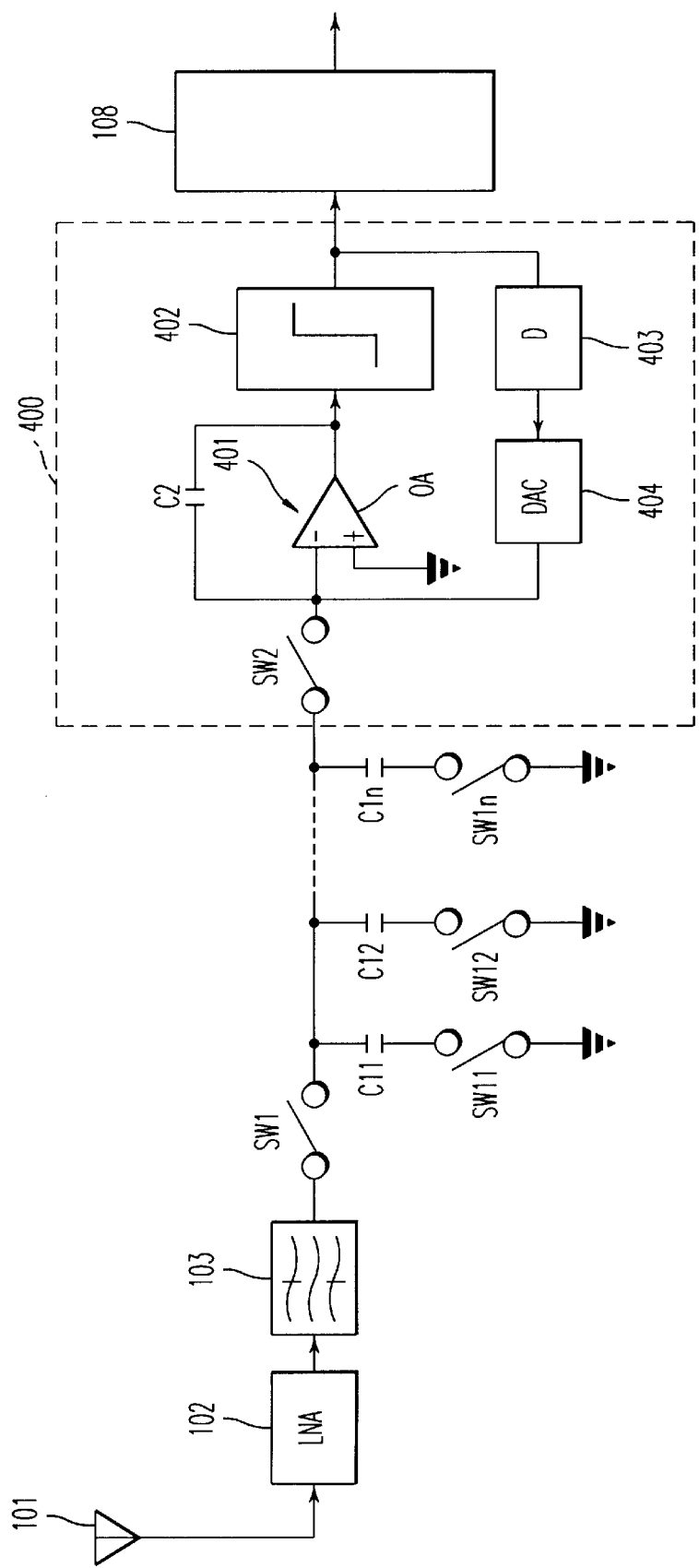
FIG. 9 is a block diagram showing the structure of a radio receiving device using a sampling system of a sixth embodiment of the present invention.

FIG. 9 is a block diagram showing the structure of a radio receiving device using a sampling system of a sixth embodiment of the present invention. In the present embodiment, the second sample and hold circuit composed of the operational amplifier OA and others in the third embodiment is realized by utilizing an integrator 401 at the first stage of a $\Delta\Sigma$ modulator 400.

That is, the $\Delta\Sigma$ modulator 400 is arranged such that after integrating the input signal by the integrator 401, 1-bit quantization is implemented on it by a comparator 402 and an output of the comparator 402 is negatively fed back to the integrator 401 via a delay circuit 403 of one sampling period and one-bit D/A converter 404. The output is taken out of the comparator and this output is input to a demodulator 108. Because the integrator 401 is composed of the operational amplifier OA and the capacitor C2, it may be operated as the second sample and hold circuit.

The basic operation of the present embodiment is the same with the third embodiment. That is, the signal output from the band-pass filter 103 is input to the sample and hold circuit having the filtering functions. The sample and hold circuit having the filtering function comprises a plurality of first sample and hold circuits composed of a plurality of capacitors C11 through C1n and a plurality of sampling switches SW11 through SW1n connected in series to the capacitors C11 through C1n, switches SW1 and SW2 inserted in series on the common input side and the common output side of the plurality of first sample and hold circuits and a second sample and hold circuit composed of an operational amplifier OA, which composes the integrator 401 within the $\Delta\Sigma$ modulator 400, and a capacitor C2 connected in parallel with the operational amplifier OA between an inversion input terminal and an output terminal thereof.

Figure 10:
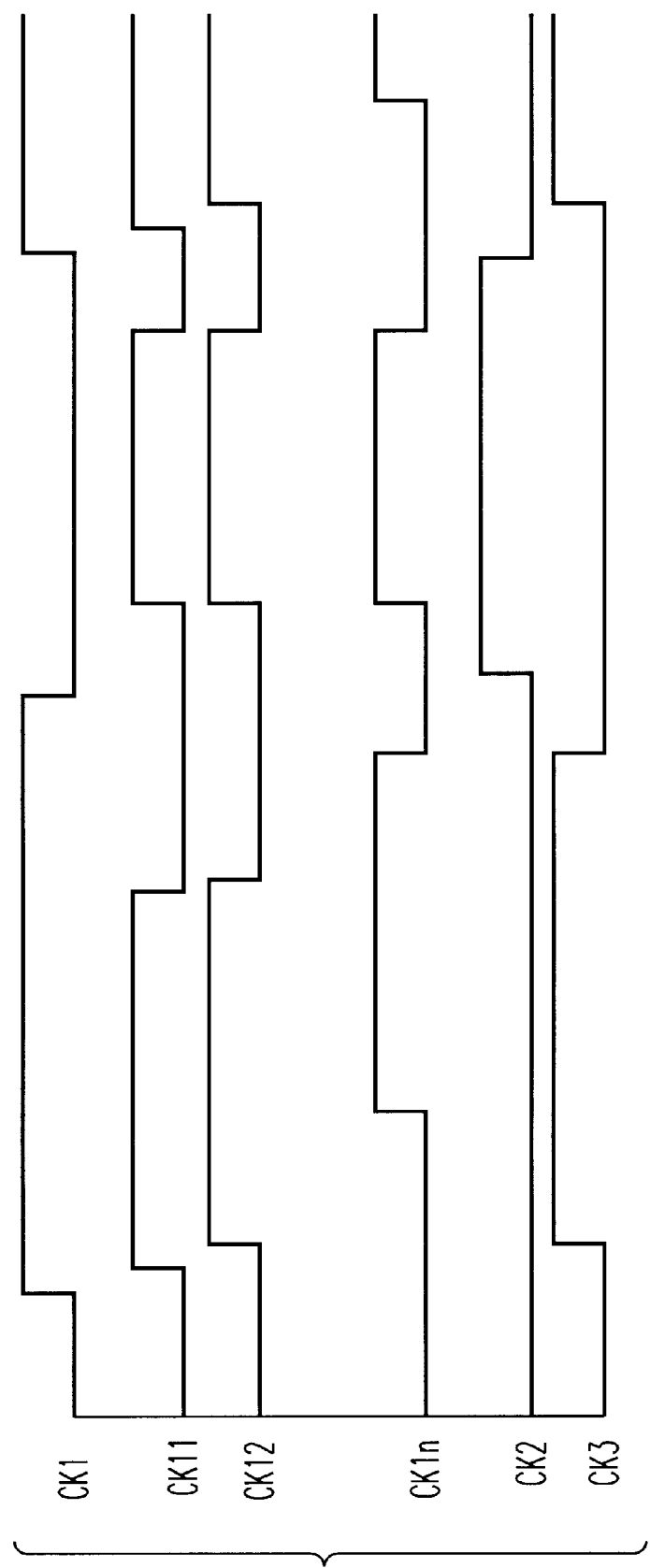
FIG. 10 is a timing chart for explaining the operation of the radio receiving device shown in FIG. 9.

The switches SW1, SW11 through SW1n, SW2 and SW3 are controlled by clocks CK1, CK11 through CK1n, CK2 and CK3 shown in FIG. 10, respectively, and are turned ON when the clock is at high level and are turned OFF when it is at low level.

At first, the switch SW1 is turned ON when the clock CK1 turns to high level. During this time, the switches SW11 through SW1n turn ON as the clocks CK11 through CK1n turn to high level sequentially and the input signal (output signal of the band-pass filter 103) is applied to the capacitors C11 through C1n sequentially. The switches SW11 through SW1n are turned OFF sequentially as the clocks CK11 through CK1n become low sequentially. Thus, the input signal is sampled at time intervals of the clocks CK11 through CK1n by the switches SW11 through SW1n and is held in the capacitors C11 through C1n.

Next, after when the clock CK1 turns to low level and the switch SW1 turns OFF, the clocks CK11 through CK1n turn to high level simultaneously and the switches SW11 through SW1n turn ON again. Then, when the clock CK2 turns to high level and the switch SW2 turns ON, the electric charge accumulated in the capacitors C11 through C1n is transferred to the capacitor C2 composing the integrator 401 within the ΔΣ modulator 400 to be added.

The sampling frequency of the plurality of first sample and hold circuit is determined by the time intervals of the leading edges of the clocks CK11 through CK1n during the period when the clock CK1 is at high level and the switch SW1 is ON and is selected to be higher than the signal band of the received modulated signal. The sampling frequency of the second sample and hold circuit is determined by the period of the clock CK3 and is lower than the sampling frequency of the first sample and hold circuit.

Further, similarly to the third embodiment, the operation of sum of products can be implemented by weighting the output of the first sample and hold circuit by differentiating the capacity of the capacitors C11 through C1n. That is, it is possible to give the filtering characteristic to the plurality of first sample and hold circuits composed of the capacitors C11 through C1n and the sampling switches SW11 through SW1n.

Although the sampling by means of the switches SW11 through SW1n must be implemented very quickly at this time, the operation of the operational amplifier OA may be slow because the transfer of the electric charge when the switch SW2 is ON may be carried out with the sampling frequency of the down-sampling in the second sample and hold circuit. It is possible to realize high speed sampling because the speed when the switch is turned OFF is very fast when the switch is composed of a CMOS transistor.

Further, because the timing for turning OFF the switch is determined by a voltage Vgs between a gate and a source of the CMOS transistor, the sampling may be carried out accurately without being influenced by the input signal voltage.

Further, the electric charge in the capacitors C11 through C1n may be accumulated across a period of time which is longer than the sampling time, so that the influence caused by time constants of the capacitors C11 through C1n and the switches SW11 through SW1n may be reduced.

Thus, the present embodiment allows the high speed sampling and the removable of the frequency component out of the band to be realized readily by the contemporary technology similarly to the third embodiment. Further, when the ΔΣ modulator 400 is used, the analog decimation filter and the down-sampling circuit may be constructed just by adding the switches SW1, SW11 through SW1n and SW2 and the capacitors C11 through C1n to that, so that the circuit structure may be simplified in the present embodiment.

It is noted that the ΔΣ modulator 400 shown in FIG. 9 has been explained by exemplifying the linear one having one integrator, the number of integrators to be connected is not limited to be only one and the higher order ΔΣ 400 more than quadratic one may be used.

While the embodiments in which the present invention is applied to the radio receiving device have been explained above, the inventive sampling system may be applied to sampling systems other than the radio receiving device and is not limited at all in terms of its use.

As described above, according to the present invention, the mixer circuit which is required to have the highly accurate characteristic like the prior art heterodyne system becomes unnecessary, the function of the IF filter having the sharp characteristics for suppressing the image signal may be given to the analog decimation filter and the miniaturization may be realized by oversampling the received modulated signal in the frequency higher than the signal band of the modulated signal in the first sampling circuit, by suppressing the component which turns out to be aliasing noise by passing the oversampled signal to the analog decimation filter and then by down-sampling it in the second sampling circuit to convert the modulated signal into the required low frequency.

Further, because the analog decimation filter may output with a low sampling rate and its operation speed is relaxed, it may be realized readily as compared to the ceramic filter and the like used in the prior art radio receiving device and the power consumption may be reduced.

The sampling frequency of each individual sampling element may be reduced and the circuit may be realized more readily by composing the first sampling circuit by a plurality of sampling elements so as to sample the modulated signal sequentially by switching by these sampling elements. Further, when the first sampling circuit is thus composed of the plurality of sampling elements, the analog decimation filter may be realized by giving the filtering function by weighting and adding the output of each sampling element.

Further, when each of the plurality of sampling elements composing the first sample and hold circuit is compose of a plurality of switches and a plurality of capacitors connected respectively in series to those switches, the output of each sampling element may be weighted by the capacity of the capacitor and the signals weighted by the capacity of the capacitors may be added by the integrator within the ΔΣ modulator disposed in the latter stage of the second sampling circuit, thus allowing the circuit structure to be simplified.

Further, when a plurality of the inventive sampling systems are disposed in parallel as a unit sampling system and the frequency characteristic of each is shifted to set the frequency band of each in the different pass band by differentiating the sampling frequency of the first and second sampling circuits in each unit sampling system and the weighting factor, the modulated signal in a wide frequency range may be frequency-converted as a whole and the receiving channel may be selected by selecting the frequency band.

While the preferred embodiments have been described, variations thereto will occur to those skilled in the art within the scope of the present inventive concepts which are delineated by the following claims.

What is claimed is:

1. A sampling system, comprising:

first sampling means composed of a plurality of sampling means for sampling an input modulated signal to sample said input modulated signal with a sampling frequency higher than the frequency band of the input modulated signal;

weighting means for weighting the outputs of said plurality of sampling elements, respectively, so as to set a frequency characteristic of the output signal;

adding means for adding the outputs of said plurality of weighting means and for removing signals of a frequency component other than a desired signal; and second sampling means for sampling the output of said adding means with a sampling frequency lower than the sampling frequency of said first sampling means and for outputting a sampled output with a frequency lower than the frequency of the input modulated signal.

2. A sampling system, comprising:

first sampling means composed of a plurality of sampling elements, composed of a plurality of switches and a plurality of capacitors connected respectively in series to said switches, for sequentially sampling an input modulated signal to sample said modulated signal with a sampling frequency higher than the frequency band of the signal and to weight the outputs of said plurality of sampling elements by the capacity of said capacitors, respectively;

analog adding means for adding the outputs of said plurality of sampling elements; and second sampling means for sampling the output of said adding means with a sampling frequency lower than the sampling frequency of said first sampling means.

3. The sampling system according to claim 1 or 2, wherein a plurality of said sampling systems are disposed in parallel as a unit sampling system and the sampling frequency of said first and second sampling means and in each unit sampling system and the weighting factors of said weighting are differentiated.

4. A radio receiving device, comprising said sampling system described in any one of claims 1 or 2;

A/D converter means for converting the output of said sampling system into a digital signal; and decoding means for decoding the digital signal output from said A/D converter means as its input.

5. The sampling system according to any one of claims 1 or 2, wherein the carrier frequency of the input modulated signal is larger than the bandwidth of the input modulated signal.

6. The sampling system according to any one of claims 1 or 2, wherein the first and second sampling means are sample and hold circuits.

7. A radio receiving device, comprising said sampling system described in claim 4;

A/D converter means for converting the output of said sampling system into a digital signal; and decoding means for decoding the digital signal output from said A/D converter means as its input.

* * * * *